United States Patent
Frank et al.

(10) Patent No.: US 11,133,158 B2
(45) Date of Patent: Sep. 28, 2021

(54) GLASS PALLET FOR SPUTTERING SYSTEMS

(71) Applicant: VIEW, INC., Milpitas, CA (US)

(72) Inventors: Trevor Frank, Milpitas, CA (US); Robert T. Rozbicki, Germantown, TN (US); Jason Satern, Morgan Hill, CA (US)

(73) Assignee: View, Inc., Milpitas, CA (US)

( * ) Notice: Subject to any disclaimer, the term of this patent is extended or adjusted under 35 U.S.C. 154(b) by 682 days.

(21) Appl. No.: 14/893,502

(22) PCT Filed: Jun. 9, 2014

(86) PCT No.: PCT/US2014/041569
§ 371 (c)(1),
(2) Date: Nov. 23, 2015

(87) PCT Pub. No.: WO2014/200927
PCT Pub. Date: Dec. 18, 2014

(65) Prior Publication Data
US 2016/0111260 A1    Apr. 21, 2016

Related U.S. Application Data

(60) Provisional application No. 61/833,366, filed on Jun. 10, 2013.

(51) Int. Cl.
*H01J 37/32* (2006.01)
*C23C 14/34* (2006.01)
(Continued)

(52) U.S. Cl.
CPC ........ *H01J 37/32715* (2013.01); *C23C 14/34* (2013.01); *C23C 14/50* (2013.01);
(Continued)

(58) Field of Classification Search
CPC ..... C23C 14/34; C23C 14/50; H01J 37/32715
(Continued)

(56) References Cited

U.S. PATENT DOCUMENTS 3,666,254 A * 5/1972 Stanke .................... F27B 21/06
266/180
3,942,967 A    3/1976 Jack et al.
(Continued)

FOREIGN PATENT DOCUMENTS

CN   101834155 A   9/2010
CN   101980935 A   2/2011
(Continued)

OTHER PUBLICATIONS

Chinese Office Action dated Jun. 5, 2017 in CN Application No. 201480039995.0.
(Continued)

*Primary Examiner* — John J Brayton
(74) *Attorney, Agent, or Firm* — Weaver Austin Villeneuve & Sampson LLP; Brian D. Griedel

(57) ABSTRACT

Pallets for transporting one or more glass substrates in a substantially vertical orientation through a sputtering system. In some cases, a pallet comprising a frame with an aperture and an adjustable grid array within the aperture. The adjustable grid array is configurable to hold a plurality of glass substrates of different shapes and/or sizes. In one case, the adjustable grid array comprises a system of vertical and horizontal support bars, wherein the vertical support bars configured to both support the plurality of glass substrates at their vertical edges, wherein the horizontal support bars are configured to support the plurality of glass substrates at their horizontal edges, wherein the ends of the horizontal support bars are slideably engaged with the vertical support bars.

18 Claims, 6 Drawing Sheets

(51) Int. Cl.
*C23C 14/56* (2006.01)
*C23C 14/50* (2006.01)
*H01L 21/677* (2006.01)
*H01L 21/673* (2006.01)

(52) U.S. Cl.
CPC .......... *C23C 14/562* (2013.01); *C23C 14/568* (2013.01); *H01J 37/32651* (2013.01); *H01J 37/32779* (2013.01); *H01L 21/6734* (2013.01); *H01L 21/6776* (2013.01); *H01L 21/67712* (2013.01); *H01J 2237/026* (2013.01); *H01J 2237/2007* (2013.01); *H01J 2237/20221* (2013.01); *H01J 2237/332* (2013.01)

(58) Field of Classification Search
USPC ........................................................ 118/500
See application file for complete search history.

(56) References Cited

U.S. PATENT DOCUMENTS

| | | | |
|---|---|---|---|
| 4,626,207 A | 12/1986 | Aubry et al. | |
| 4,770,121 A * | 9/1988 | Ebata | C23C 16/54 118/500 |
| 5,244,559 A * | 9/1993 | Latz | C23C 14/50 118/50.1 |
| 5,263,571 A * | 11/1993 | Crandall | B41M 1/34 198/502.1 |
| 5,683,561 A * | 11/1997 | Hollars | H01J 37/3405 204/298.25 |
| 6,047,813 A * | 4/2000 | Herzog | B65G 17/002 198/465.3 |
| 7,070,660 B2 * | 7/2006 | Keeton | C23C 16/45521 118/500 |
| 7,407,358 B2 * | 8/2008 | Takahashi | H01L 21/67742 204/298.15 |
| 8,092,607 B2 * | 1/2012 | Pollack | B65G 49/061 118/50 |
| 2002/0033133 A1 * | 3/2002 | Klein | C23C 14/50 118/500 |
| 2005/0019678 A1 * | 1/2005 | Nakatsu | G03F 1/60 430/5 |
| 2006/0219547 A1 * | 10/2006 | Tuttle | H01L 21/67155 204/192.12 |
| 2009/0139864 A1 | 6/2009 | Nakamura et al. | |
| 2010/0044213 A1 * | 2/2010 | Wolf | C23C 14/50 204/192.12 |
| 2010/0194505 A1 * | 8/2010 | Brass | H01L 21/68728 335/285 |
| 2012/0048186 A1 | 3/2012 | Brüning et al. | |
| 2013/0222878 A1 | 8/2013 | Greer et al. | |
| 2013/0263784 A1 * | 10/2013 | Lee | C03C 17/00 118/723 R |
| 2016/0002780 A1 * | 1/2016 | Heimel | C23C 16/4587 118/729 |
| 2020/0381223 A1 | 12/2020 | Neilan et al. | |

FOREIGN PATENT DOCUMENTS

| | | | |
|---|---|---|---|
| CN | 103814154 A | | 5/2014 |
| DE | 9301727 U1 | | 3/1993 |
| DE | 4139549 A1 | | 6/1993 |
| JP | 11-036074 A | | 2/1999 |
| JP | 2006-225748 A | | 8/2006 |
| RU | 2297988 C1 | | 4/2017 |
| SU | 1491821 A1 | | 7/1989 |
| SU | 1616861 A2 | | 12/1990 |
| SU | 1719327 A1 | | 3/1992 |
| WO | PCT/EP2013/05540 | * | 3/2013 |
| WO | WO2013/044941 A1 | | 4/2013 |
| WO | WO 2013/082279 A1 | | 6/2013 |
| WO | WO 2014/200927 A1 | | 12/2014 |
| WO | WO2019/177871 A1 | | 9/2019 |

OTHER PUBLICATIONS

Chinese Office Action dated Jun. 5, 2018 in CN Application No. 201480039995.0.
European Extended Search Report dated Jan. 31, 2017 in EP Application No. 14811203.0.
European Office Action dated Apr. 17, 2019 in EP Application No. 14811203.0.
Russian Office Action dated May 21, 2018 in RU Application No. 2015154983.
Russian Office Action dated Feb. 21, 2019 in RU Application No. 2015154983.
International Search Report and Written Opinion dated Oct. 27, 2014 in PCT/US2014/041569.
International Preliminary Report on Patentability dated Dec. 23, 2015 in PCT/US2014/041569.
International Search Report and Written Opinion dated May 29, 2019 PCT/US2019/021227.
Indian Office Action dated Nov. 14, 2019 in Indian Application No. 4155/KOLNP/2015.
Canadian Office Action dated Oct. 13, 2020 in Canadian Application No. 2,914,658.
International Preliminary Report on Patentability dated dated Sep. 24, 2020 PCT/US2019/021227.
U.S. Appl. No. 15/733,514, filed Aug. 18, 2020, Nielan et al.
Preliminary Amendment dated Aug. 18, 2020 for U.S. Appl. No. 15/733,514.
Chinese Office Action dated Nov. 17, 2020 in CN Application No. 201480039995.0, with English Translation.
Office Action dated Jun. 7, 2021 in EP Application No. 14811203.0.

* cited by examiner

| ENTRY LOAD LOCK 102 | TCO LAYER STATION 106a | EC LAYER STATION 106b | IC LAYER STATION 106c | CE LAYER STATION 106d | LITHIUM STATION 106e | TCO LAYER STATION 106f | EXIT LOAD LOCK 104 |
|---|---|---|---|---|---|---|---|

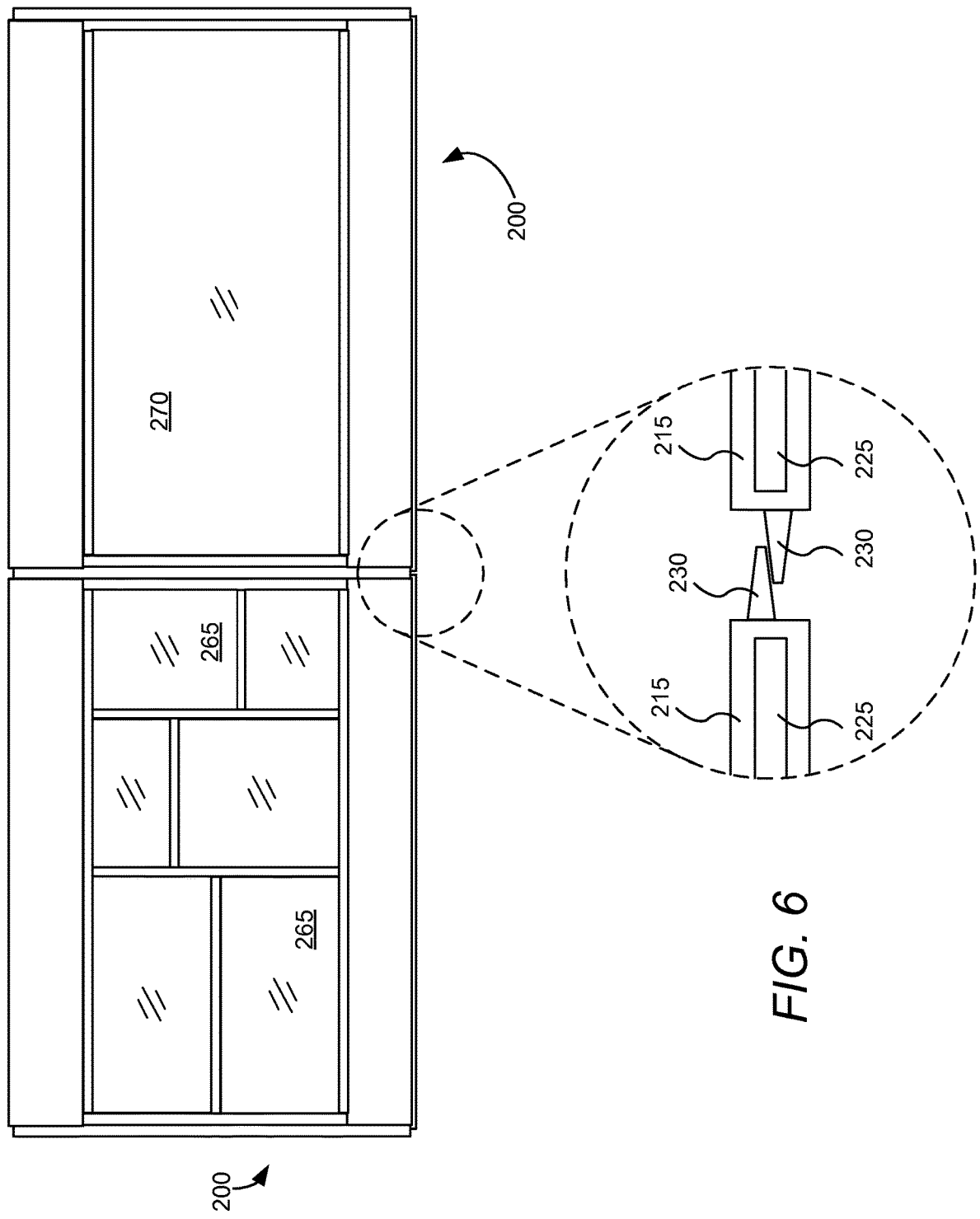

GLASS PALLET FOR SPUTTERING SYSTEMS

CROSS-REFERENCE TO RELATED APPLICATIONS

This application is a national stage application under 35 U.S.C. § 371 to International Application PCT/US2014/041569 (designating the United States), filed on Jun. 9, 2014 and titled "GLASS PALLET FOR SPUTTERING SYSTEMS," which claims benefit of and priority to U.S. Provisional Patent Application No. 61/833,366 entitled titled "GLASS PALLET FOR SPUTTERING SYSTEMS" and filed on Jun. 10, 2013; all of which are hereby incorporated by reference in their entirety and for all purposes.

FIELD

Embodiments disclosed herein generally relate to sputtering systems and methods, and more particularly to pallets for holding substrates in sputtering systems. More particularly, embodiments disclosed herein relate to pallets for holding glass, for example, glass used for windows.

BACKGROUND

Processing of large area glass is typically done on horizontal format processing equipment. Conventional wisdom dictated that since large area glass was produced from a tin float line, which is a horizontal system, that further processing of the glass should naturally be in the horizontal position. Additionally, since supporting large area glass is easily done using rollers upon which the glass is supported at many points, it was natural to translate the glass along horizontally, all the while being supported at many points on the back surface. Thus, sputtering on large area glass substrates is conventionally performed horizontally, although there are some apparatus that sputter large area substrates vertically, e.g., using what are essentially conveyer type horizontal systems with rollers, where the conveyer is tilted at some angle above horizontal but less than 90 degrees so that the glass still rests, via gravity, on rollers as it moves through the sputter system. There also exist pallets that may carry smaller substrates through sputter systems. However, there still remains a need for pallets that will accommodate large area glass, particularly thicker heavy glass or a plurality of glass substrates, even more particularly a plurality of glass substrates of varying sizes and/or shapes.

SUMMARY

Embodiments include pallets for transporting one or more substrates, particularly glass substrates, through a sputtering apparatus in a substantially vertical orientation. Pallets described herein provide flexibility in carrying one or more substrates of varying sizes and shapes.

Certain embodiments pertain to a pallet for transporting a plurality of glass substrates through a sputtering apparatus. The pallet comprises a frame including an aperture and an adjustable grid array within the aperture. The adjustable grid array is configurable to hold a plurality of glass substrates of different shapes and/or sizes, wherein the pallet is configured to hold the plurality glass substrates, each by at least two edges, and in a substantially vertical orientation during transport through the sputtering apparatus. Pallets described herein are configured to hold either a single large glass substrate, for example between about 60 inches and 130 inches on one dimension, and between about 72 inches and about 205 inches on the other dimension, or a plurality of smaller glass substrates.

In some embodiments, a pallet for transporting a glass substrate through a sputtering apparatus, comprises a frame and an aperture in the frame. The pallet is configured to hold the glass substrate by at least two edges, and in a substantially vertical orientation during transport through the sputtering apparatus. In these embodiments, the glass substrate has dimensions of between about 60 inches and about 130 inches along one side and between about 72 inches and 205 inches along an other side, and the glass substrate has a thickness of between about 2 mm and about 20 mm.

In certain embodiments, pallets are configured to maintain even temperatures on the one or more substrates. For example, in one embodiment the pallets are configured to maintain their temperature to within ±5° C. of the temperature of the glass substrate(s) they carry during sputtering. In certain embodiments, pallets are configured to carry and/or absorb the heat load in the sputter apparatus so that their thermal profile approximates that of the glass substrate(s) which they carry. In this way, differences in thermal expansion and contraction rates, as well as the thermal profile on the glass substrates is substantially uniform. The pallets may be transported through a sputter system using mechanical means, and optionally magnetic levitation.

Certain embodiments pertain to an adjustable grid array configured to hold a plurality of glass substrates. In one embodiment, the adjustable grid array includes a system of vertical and horizontal support bars. The vertical support bars are configured to support the plurality of glass substrates at their vertical edges. The horizontal support bars are configured to support the plurality of glass substrates at their horizontal edges. The ends of the horizontal support bars may be slideably engaged with the vertical support bars. Also, the vertical support bars may be slideably engaged with the frame of the pallet either directly or via an attachment means which is itself slideably engaged with the frame of the pallet. Such adjustable grid arrays may simplify glass loading and unloading from the pallet.

In some embodiments, an integrated sputter deposition system comprise a plurality of deposition stations, a plurality of pallets an a drive system for controlling movement of the plurality of pallets through the plurality of deposition stations. Each pallet comprises a frame with an aperture, and an adjustable grid array within the aperture. The adjustable grid array is configurable to hold each of a plurality of glass substrates at at least two edges in a substantially vertical orientation during transport through the plurality of deposition stations.

These and other embodiments are described in more detail below.

BRIEF DESCRIPTION OF THE FIGURES

FIG. 6 depicts association of two pallets.

DETAILED DESCRIPTION

Although certain embodiments are described in terms of a pallet for holding glass substrates in a sputtering apparatus, the disclosure is not so limited. The substrates may be of any material and the work performed on the substrates need not be sputtering.

Certain embodiments are directed to pallets configured to hold one or more glass substrates as they translate through a sputtering apparatus, for example a sputtering apparatus used to sputter deposit one or more coatings on the glass substrates. This is described in a non-limiting example of an all vacuum integrated sputter apparatus used to deposit a solid state and inorganic electrochromic device. Some examples of electrochromic devices can be found in U.S. patent application Ser. No. 12/772,055 (now U.S. Pat. No. 8,300,298) titled "ELECTROCHROMIC DEVICES" and filed on Apr. 30, 2010, which is hereby incorporated by reference in its entirety.

Figure 1A:
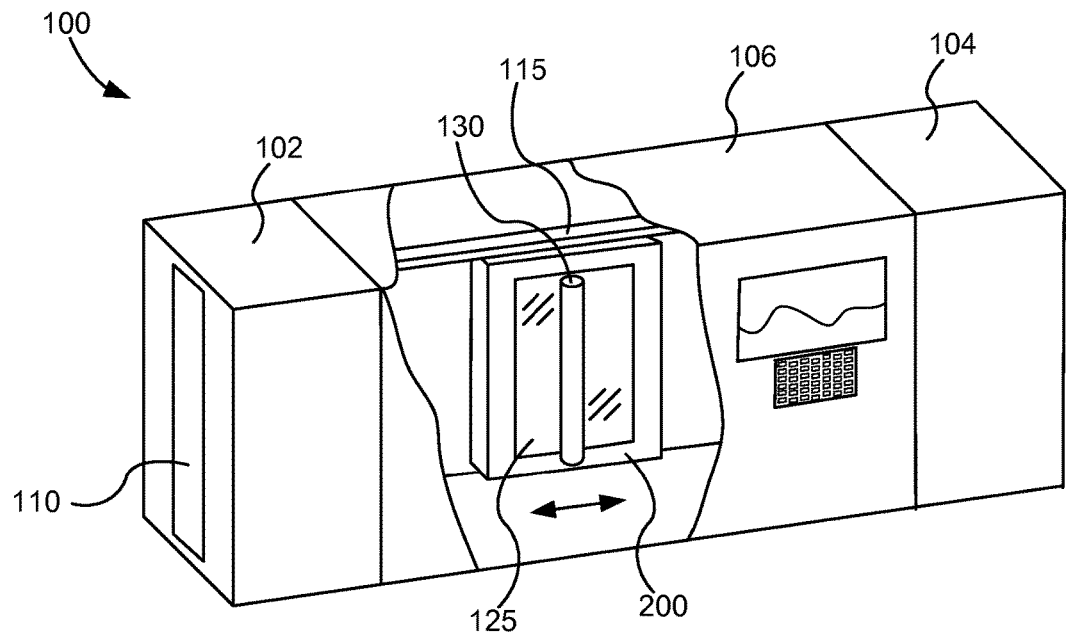
FIGS. 1A and 1B depict a sputtering apparatus.

Referring to FIG. 1A, a sputtering apparatus, 100, may include an entry port, 110, for introducing a pallet, 200, carrying a substrate, 125, into the system, including entry and exit load locks, 102 and 104, respectively, for entry and removal of the one or more such pallets from the sputtering apparatus. The load locks allow pallets to be introduced and removed from the system without disturbing the controlled ambient environment of the system. Integrated deposition system 100 has a module or modules, 106, with a plurality of deposition stations, for example sputter deposition stations. FIG. 1A depicts a simplified version of integrated deposition system 100 in perspective view and including a cutaway view of the interior. In this example, system 100 is modular, where entry load lock 102 and exit load lock 104 are connected to deposition module 106. In this example, pallet 200 is suspended from a track, 115, but pallet 200 could also be supported by a track located near the bottom of apparatus 100 or a track, e.g. mid-way between top and bottom of apparatus 100. Pallet 200 can translate (as indicated by the double headed arrow) forward and/or backward through system 100. For example, during lithium deposition, the pallet holding the one or more glass substrates may be moved forward and backward in front of a sputter target, 130 (e.g., lithium metal sputter target), making multiple passes in order to achieve the lithiation desired. Pallet 200 may be supported by hanging from and/or resting upon, a rail, chain, magnetic levitation, or similar conveyance means.

Figure 1B:
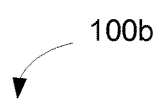

Referring to FIG. 1B, a sputter deposition apparatus, 100b, for example, includes an entry load lock, 102, followed by (in contiguous and serial arrangement) a transparent conducting oxide (TCO) deposition station, 106a, an EC layer deposition station, 106b, an ion conductor (IC) layer deposition station, 106c, a CE layer deposition station, 106d, a lithium deposition station, 106f, and an exit load lock, 104. In the broadest sense, integrated sputter deposition systems need not have load locks, e.g., module(s) 106 could alone serve as the integrated deposition system. For example, the substrate may be loaded into module 106, the controlled ambient environment established and then the substrate processed through various stations within the system. Shields or similar means may be used between stations to avoid contamination from adjacent stations. Individual stations within an integrated deposition systems can contain heaters, coolers, various sputter targets and means to move them, RF and/or DC power sources and power delivery mechanisms, etching tools e.g. plasma etch, gas sources, vacuum sources, glow discharge sources, process parameter monitors and sensors, robotics, power supplies, and the like.

Pallet 200 is in a substantially vertical orientation and/or it holds the glass substrate(s) in a substantially vertical orientation. In certain embodiments, a substantially vertical orientation is an orientation between about 1 degree and about 5 degrees from vertical. In one embodiment, a substantially vertical orientation is an orientation about 3 degrees from vertical. A substantially vertical orientation helps prevent defects in the material layers deposited on the substrate because particulate matter that may be generated, e.g., from agglomeration of atoms from sputtering, will tend to succumb to gravity and therefore not deposit on the substrates. Also, a substantially vertical orientation of substrates traversing stations of an integrated deposition system, especially large area substrates, can enable coating of thinner glass substrates since there is less concern over sag that could occur in hot glass substrates in the horizontal orientation (i.e. there may be sagging toward the center of a large area substrate due to lying horizontally).

Examples of deposition systems having a substrate transported through deposition stations in a substantially vertical orientation can be found in U.S. patent application Ser. No. 12/645,111, titled "FABRICATION OF LOW DEFECTIVITY ELECTROCHROMIC DEVICES," filed on Dec. 22, 2009 and U.S. patent application Ser. No. 12/645,159 (now U.S. Pat. No. 8,432,603), titled "ELECTROCHROMIC DEVICES," filed on Dec. 22, 2009, which are hereby incorporated by reference in their entirety.

Figure 5:
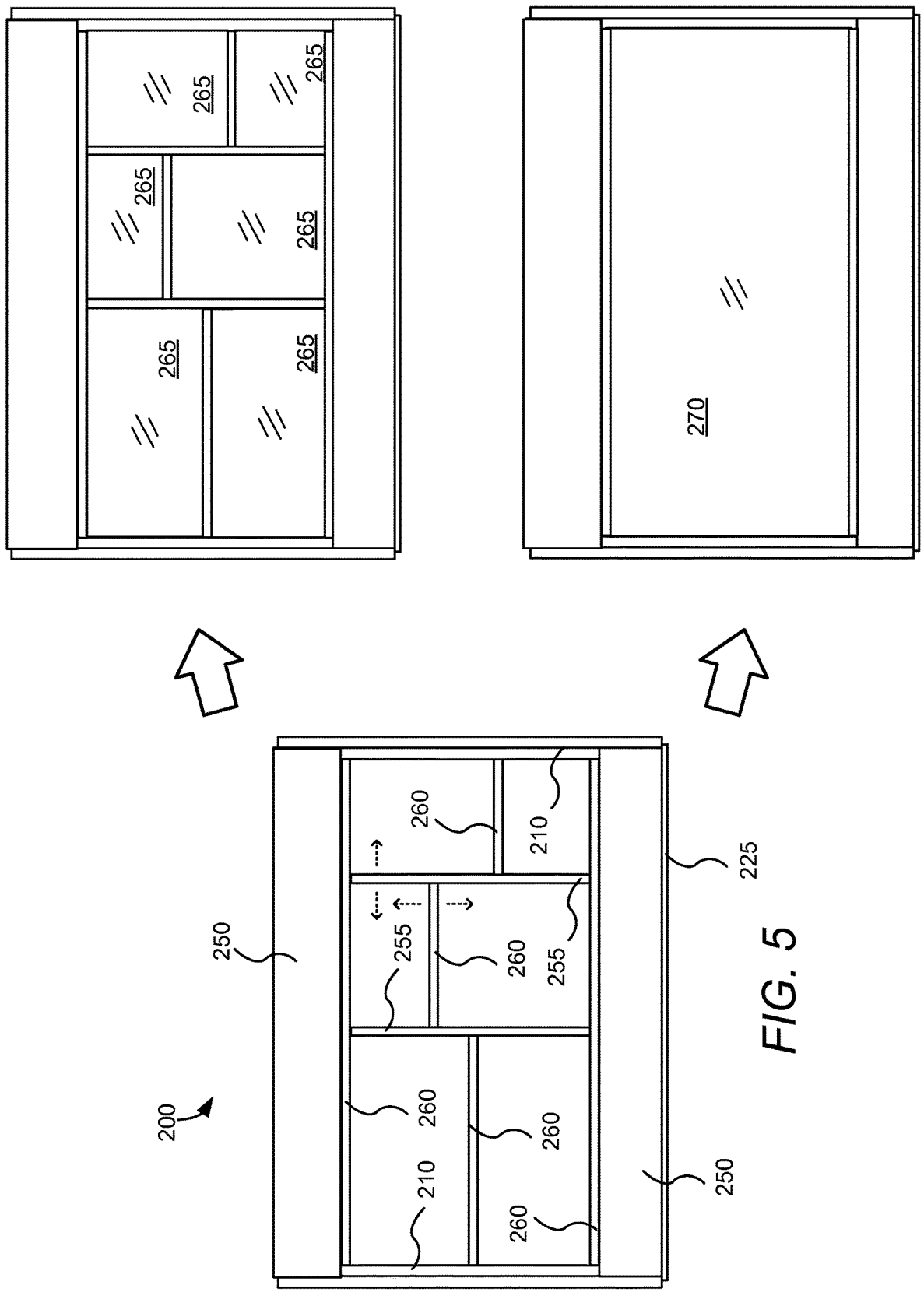
FIG. 5 depicts aspects of an adjustable grid array for a pallet.

One embodiment is a pallet for transporting a plurality of glass substrates through a sputtering apparatus, the pallet including a frame having an aperture and an adjustable grid array within the aperture. The adjustable grid array is configurable to hold a plurality of glass substrates of different shapes and/or sizes. The adjustable grid array is configured to hold the plurality glass substrates, wherein each glass substrate is held by at least two edges, and in a substantially vertical orientation during transport through the sputtering apparatus. Pallets described herein are configured to hold either a single large glass substrate, for example between about 60 inches and 130 inches on one dimension, and between about 72 inches and about 205 inches on the other dimension or a plurality of smaller glass substrates. An "aperture" can refer to a collection of bars, supports, etc. that define a generally glass-shaped region which is the aperture. This aperture can be sized and shaped to accommodate (e.g., hold during deposition) one or more glass substrates at the same time. FIG. 5 depicts an example of this. In such implementation, the pallet includes "sub-apertures" each sized and shaped to accommodate a separate smaller glass substrate.

One embodiment is a pallet for transporting a plurality of glass substrates through a sputtering apparatus, wherein the pallet includes a frame having an aperture, and an adjustable grid array within the aperture. The adjustable grid array is configurable to hold at least one of: a plurality of glass substrates each having a minimal dimension of at least 10 inches along one side, and a dimension between about 10 inches and about 120 inches along the other side; a pair of glass substrates each having a minimal dimension of between about 36 inches and 84 inches along one side, and a maximum dimension of between about 48 inches and 120 inches along the other side; and a single glass substrate that is at least about 60 inches along one side and between about 60 inches and 120 inches along the other side; wherein the pallet is configured to hold the plurality of glass substrates, each by its edges, and to hold the plurality of glass substrates in a substantially vertical orientation during transport through the sputtering apparatus. In one case, the aperture is at least about 60 inches on one dimension. In one case, the aperture is at least about 60 inches on one dimension and on the other dimension. In one case, the aperture is between about 72 inches and 84 inches on one dimension, and between about 72 inches and about 120 inches on the other dimension. Certain pallets described herein can hold glass substrates between about 2 mm and about 20 mm thick.

Figure 2:
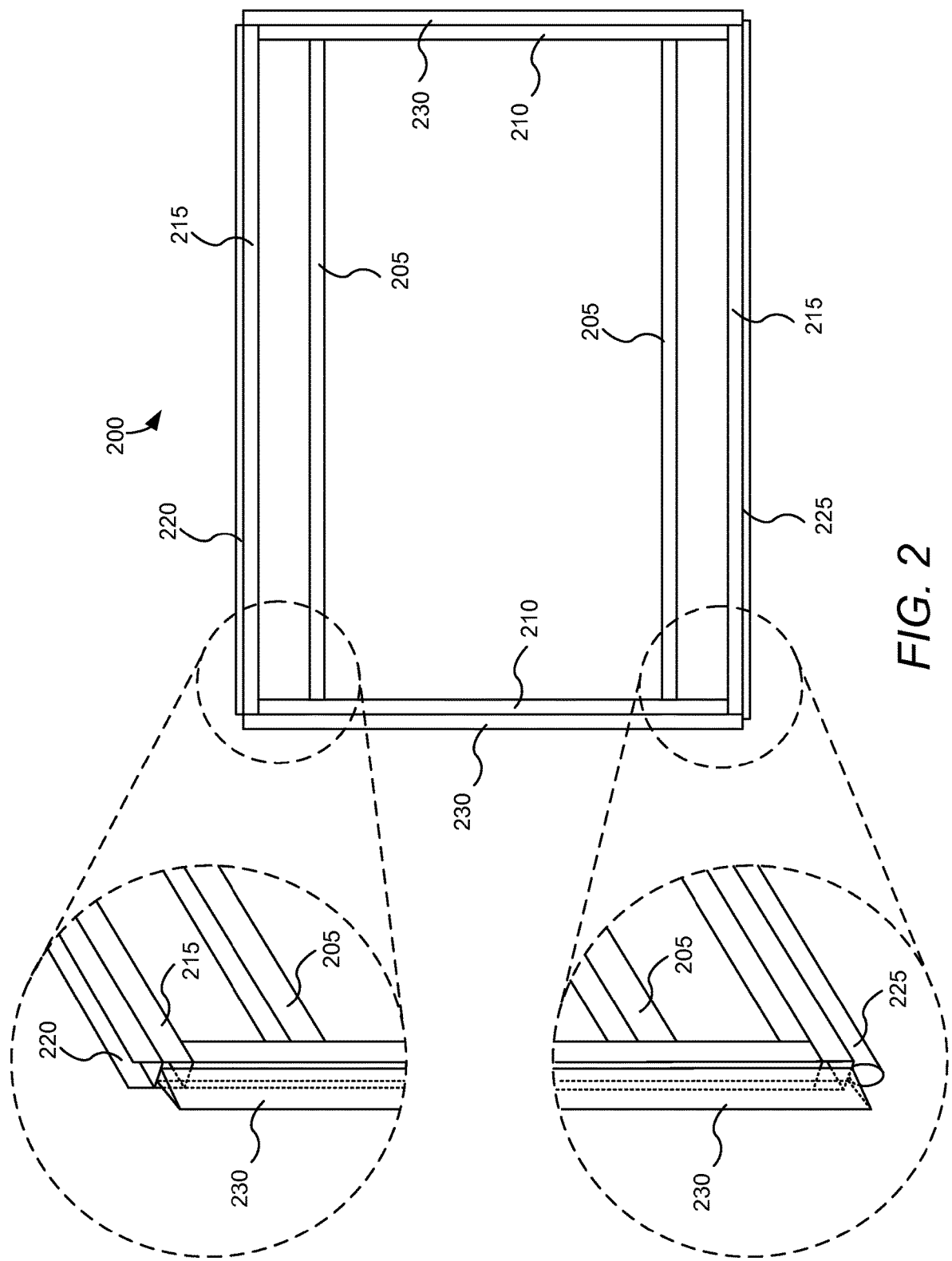
FIG. 2 depicts aspects of a pallet.

FIG. 2 depicts one embodiment of a pallet, 200. FIG. 2 includes a side view and two expanded portions (dotted circles) that are in perspective view to show detail. In this example, pallet 200 is constructed of stainless steel, but in other embodiments may be constructed of other suitable materials. In one embodiment, the pallet weighs less than about 700 kg. Pallet 200 may include an electrically conductive material configured to establish electrical communication with an electrically conductive coating on the work surface of each of the plurality of glass substrates or on a single glass substrate (e.g., a single large glass substrate). In this example, pallet 200 has a frame which includes inner horizontal frame members, 205. An aperture is defined by horizontal frame members 205 and the vertical frame members, 210. Frame members 205 allow for thermal isolation of the aperture region. For example, if heating the substrate(s) during sputtering, the aperture region where the substrate(s) are located is thermally isolated from the upper and lower (outermost) horizontal frame members, 215, so as to minimize issues associated with thermal expansion and contraction near a guide plate, 220, along the top of the frame and a guide bar, 225, along the bottom of the frame. This thermal isolation also minimizes bending of the vertical grid mounts (see, for example, FIG. 4, item 240) and horizontal support bars (see, for example, FIG. 5, item 260) which allows for stable support of the glass substrate(s) held by pallet 200. In one embodiment, the pallet is configured to maintain its temperature to within ±15° C. of the temperature of the single or the plurality of glass substrates during sputtering. In another embodiment, the pallet is configured to maintain its temperature to within ±10° C. of the temperature of the glass substrate(s) during sputtering. In another embodiment, the pallet is configured to maintain its temperature to within ±5° C. of the temperature of the glass substrate(s) during sputtering. That is, in certain embodiments, pallets are configured to carry and/or absorb the heat load in the sputter apparatus so that their thermal profile approximates that of the glass which they carry. In this way, differences in thermal expansion and contraction rates, as well as the thermal profile on the glass substrates, may be maintained as substantially uniform. For example, since the pallet has a different volume than the glass substrate(s) and is typically steel or other metal, the pallet transfers heat differently than glass. In certain embodiments, pallets are configured so that their thicknesses and tolerances are appropriately sized to attain and maintain a similar thermal profile as the glass they carry. For example, temperature sensors (thermocouples) may be used on "dummy" runs to map the thermal profile of carrier and glass. Using these test runs, pallet configuration can be refined until a configuration and thermal mass are appropriate for the sputter process conditions to be used. Computer modeling (e.g. finite element analysis) may also be used to configure the pallets appropriately for the sputtering envisioned. Pallets described herein are "thermally matched" to the glass substrates with appropriate choice of materials taking into consideration thermal mass, thermal conductivity, modulus and emissivity, CTE and the like to maintain the adjustable grid array, pallet frame defining the aperture and any intervening attachment means and shields attached to the pallet close to the glass temperature during processing.

Referring again to FIG. 2, guide plate 220 aids alignment with, e.g., rollers in a sputtering apparatus and guide bar 225 aids alignment with a drive system in a sputtering apparatus; however one or both of these may be replaced with other suitable components to aid translation through the sputtering apparatus. In the example depicted in FIG. 2, guide plate 220 is constructed of a U-channel so that wheels (or other guide mechanism) may ride between the vertical portions of the U-channel. Guide rail 225 allows pallet 200 to glide across concave wheels during transport through the sputter coater. In certain embodiments, the pallet is configured to hang from a drive system of a sputter apparatus. In some embodiments, magnetic levitation is used to support the pallet as it traverses through a sputtering system.

Also depicted in FIG. 2, on the left and right edge of the frame of pallet 200, are overlapping portions, 230, used to prevent backside exposure to sputtering materials. That is, in certain embodiments, pallets are either connected in series to form a train of pallets, and overlapping portions 230 prevent sputtered materials from reaching the backside of the pallet (and the plurality of glass substrates) or the pallets are not physically connected, but occasionally abut one another in the sputtering apparatus and thus allow overlapping portions 230 to block backside contamination (see also FIG. 6 and associated description). Overlapping portions 230 also protect the sputter chamber on the backside of the pallet from sputtered material. This reduces cleaning and maintenance, and obviates the need for further shielding on the coater surfaces on the non-sputter side of the pallet (if single sided sputter apparatus is used).

In certain embodiments, the pallet's frame includes a U-channel construction. In one embodiment, a hot rolled U-channel is used. The U-channel may be of stainless steel construction, for example. For example, pallet 200 may be constructed of a U-channel welded into a unitary frame or the frame may include an assembly of U-channel pieces fastened in another way, such as bolted together. In certain embodiments, certain components of the pallet are welded and others bolted to take advantage of the properties of both attachment means.

Figure 3:
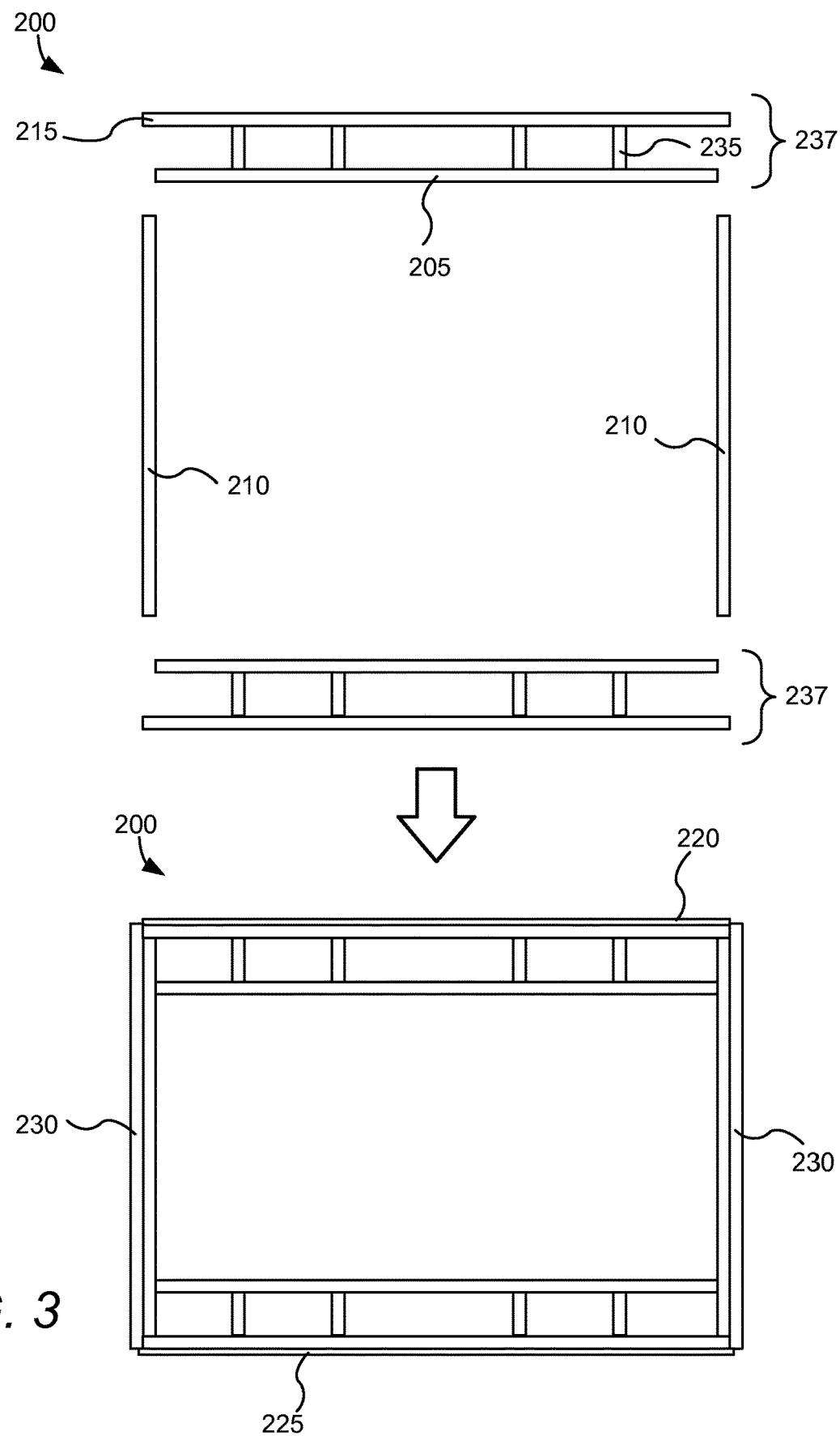
FIG. 3 depicts components of a pallet and assembly of a pallet frame.

FIG. 3 depicts an exploded view of pallet 200 with an assembly of all U-channel construction. In this example, the pallet frame includes four welded units that mate (e.g., bolt together, two vertical frame sections, 210, along with two horizontal frame sections, 237 (which include horizontal frame members 205 and 215 welded together via short struts, 235). As depicted in the bottom portion of FIG. 3, guide plate 220, guide rail 225 and overlapping sections 230 are attached, e.g., bolted to the frame thus created. Certain pallets described herein are very large, sometimes weighing several hundred kilograms (e.g., about 700 kg) and thus, if these pallets are mishandled, they can be damaged due to their own weight impacting against another object. Using U-channel saves significantly on weight, so that lighter pallets can be achieved. Also, by using modular pallet components, the pallet can be disassembled for cleaning and/or individual components (e.g. damaged or defective) can be replaced without scrapping the entire pallet.

As certain pallets may be very large, and heavy, an assembly jig may be used to position sections of the pallet prior to bolting them together. An assembly jig allows the pallet to be designed without costly machining of surfaces and registration elements. Critical surfaces are aligned on the jig while the modular pieces are assembled, for example bolted and/or welded. One embodiment is an assembly jig for a pallet as described herein.

Figure 4:
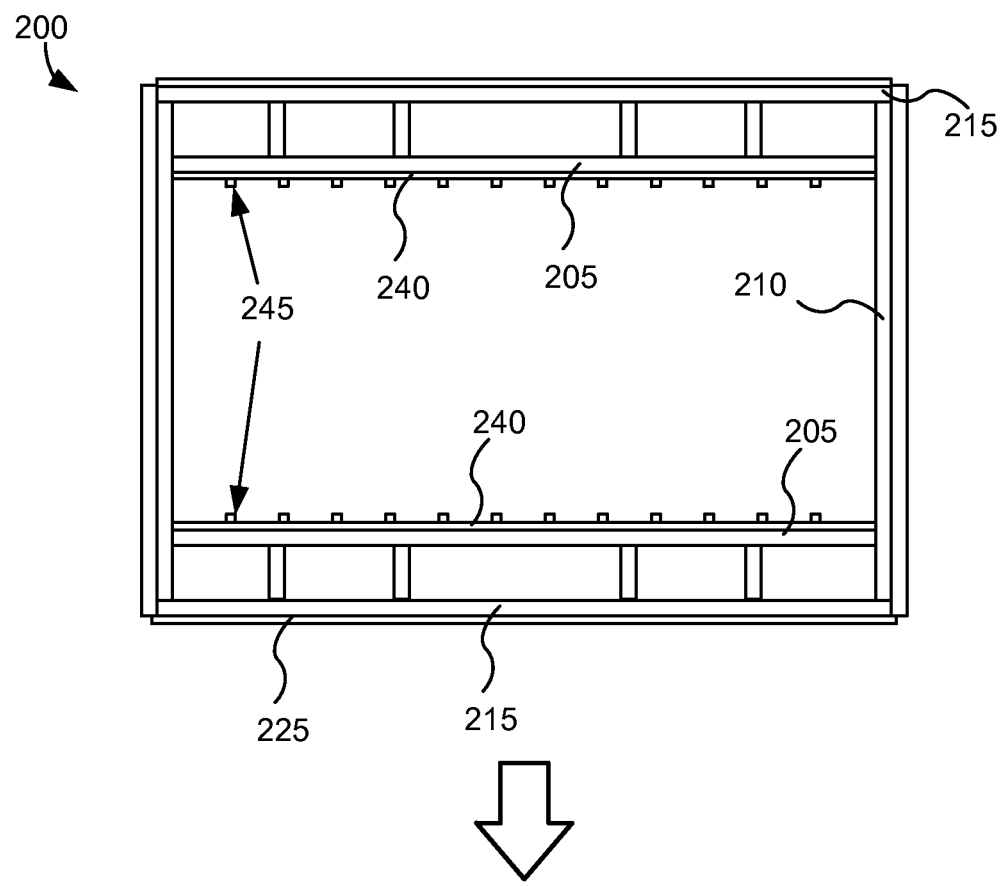
FIG. 4 depicts vertical grid mounts and shields of a pallet.
Figure 4:
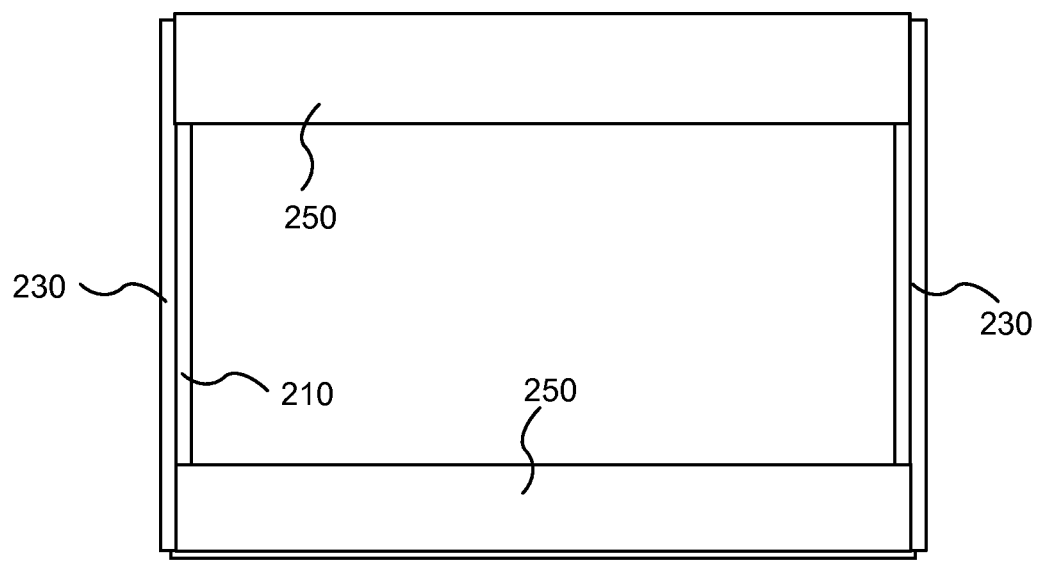

Certain pallets described herein may be used to hold one or more glass substrates. The aperture region is where substrates reside when they are supported by the pallet. FIG. 4 depicts pallet 200 with vertical grid mounts, 240, configured along the top and bottom inner edge of the aperture of the pallet. Vertical grid mounts include a plurality of studs, 245, for attaching vertical support bars (see FIG. 5, item 255). In this depiction, there are many studs 245 along the surface of vertical grid mounts; however, there need only be enough studs as vertical support bars needed (see FIG. 5 and associated description). The studs may be slideably engaged with the vertical grid mount's body, so that when a vertical support bar (see FIG. 5, item 255, and associated description) is mounted to the stud, the assembly can move laterally along the vertical grid mount so as to accommodate thermal expansion of the glass substrate(s). In certain embodiments, rather than studs, clamping blocks are used to affix vertical support bars to the vertical grid mount's body. In one embodiment, a clamping block has a unitary body with a channel for accommodating a vertical support bar. The vertical support bar may be slideably engaged with the clamping block, while the clamping block is affixed to the vertical grid mount's body. In one embodiment, the clamping block is configured to clamp onto the vertical grid mount body, e.g., via a set screw engaging the vertical grid mount to pull a portion of the clamping block against the vertical grid mount and thereby clamp it to the vertical grid mount. The vertical grid mounts may optionally include an alloy that expands and contracts to approximate the thermal expansion and contraction of the glass substrate(s) during sputtering and/or heating in the sputtering apparatus.

The pallet may further comprise one or more shields, 250, to cover portions (e.g., backside portions) of the pallet during sputtering. This is depicted in the bottom portion of FIG. 4. In one embodiment, the one or more shields attach to the pallet's frame with wing nuts, clips, hooks or other temporary attachment means, thus they are not permanently attached to the frame of the pallet. In certain embodiments, the shield retaining feature accommodates differences in thermal expansion between the one or more shields and the frame. This may be accomplished, for example, by having the shields loosely attached, e.g., with clips that allow the shields to expand and contract with sliding contact with the frame. Shields may be used to cover portions of the pallet as depicted (not within the aperture) and/or to serve as surrogates for glass substrates (occupying area in the aperture that a substrate would otherwise occupy) when a substrate is not desired in a particular area in the aperture during processing. For example, shields may also be used in a pallet to fill the entire aperture in order to "burn in" a particular sputter target or targets in the sputter apparatus. Shields may be affixed to the pallet before or after the glass substrate(s) are loaded into the pallet.

In certain embodiments, the pallet comprises an adjustable grid array. The adjustable grid array may take alternate forms. In one embodiment, the adjustable grid array includes a system of vertical and horizontal support bars. The vertical support bars are configured to both support the plurality of glass substrates along their vertical edges and the horizontal support bars at their ends (i.e., horizontal edges), where the ends of the horizontal support bars are slideably engaged with the vertical support bars. In another embodiment, the adjustable grid array may include a system of vertical support bars configured to support each of the plurality of glass substrates along their vertical edges and horizontal clips configured to both hold and mask the edges of adjoining glass substrates. In yet another embodiment, the adjustable grid array may include a system of vertical support bars configured to support each of the plurality of glass substrates along their vertical edges, and where glass substrates are stacked upon each other vertically with no intervening horizontal support between adjoining glass substrates.

In one embodiment, the adjustable grid array includes a system of vertical and horizontal support bars. The vertical support bars are configured to both support the plurality of glass substrates along their vertical edges as well the horizontal support bars at their ends. In this case, the ends of the horizontal support bars are slideably engaged with the vertical support bars (e.g., the vertical support bars are slotted to accommodate the ends of horizontal bars engaged therewith). As described above, in certain embodiments, the vertical support bars are affixed to a vertical grid support/mount, e.g., using studs or clamps. The vertical support bars may be slideably engaged with the vertical grid support/mount. In this way, physical flexibility is built into the glass holding system to account for thermal expansion differences between the glass and the pallet materials, while still holding the glass substrate(s) for sputtering during transport through the deposition stations. Also, such an apparatus allows for configuration flexibility, that is, many different sizes of glass can be accommodated with such an adjustable grid array. One such embodiment is depicted in FIG. 5.

FIG. 5 depicts pallet 200 (with shields 250 as depicted in FIG. 4), where the aperture of the frame is occupied with an adjustable grid array, including (5) horizontal support bars, 260, and (4) vertical support bars, 255. Horizontal support bars 260 are slideably engaged with vertical support bars, 255. The frame includes vertical grid mounts (see FIG. 4, item 240), configured along the top and bottom inner edge of the frame (in FIG. 5 the vertical grid mounts are hidden by shields 250). Vertical grid mounts include an alloy that expands and contracts to approximate the thermal expansion and contraction of the plurality of glass substrates during sputtering and/or heating in the sputtering apparatus. Vertical support bars 255 are attached to (e.g. via studs or clamps, e.g. a clamping block as described herein) and slideably engaged with vertical grid mounts 240. That is, if the studs or other mounts for the vertical support bars 255 are not stationary, but rather slide along vertical grid mounts 240, for example within a channel along the length of 240, and the horizontal support bars 260 are also slideably engaged with the vertical support bars, then the grid array can expand and contract (both in the x and y direction as indicated by the dashed arrows in FIG. 5) without necessarily having to match CTE of glass or other substrates; i.e. the support members can slide along each other both in the vertical and horizontal direction to simultaneously account for vertical and horizontal expansion of the substrate(s). However it may also be desirable to include materials with CTE's similar to those of glass substrate(s).

As depicted in FIG. 5, the adjustable grid array allows for a wide variety of glass, 265, sizes to be held by the pallet or a single large glass sheet, 270. Thus differing sizes of glass may be held simultaneously. One embodiment is a pallet for transporting a plurality of glass substrates through a sputtering apparatus. The pallet comprises a) frame comprising an aperture and b) an adjustable grid array within the aperture. The adjustable grid array is configurable to hold a plurality of glass substrates of different shapes and/or sizes. The pallet is configured to hold each of the plurality glass substrates by at least two edges in a substantially vertical orientation during transport through the sputtering apparatus. Certain pallets described herein can hold glass substrates between about 2 mm and about 20 mm thick.

In certain embodiments, the adjustable grid array comprises a system of vertical and horizontal support bars. The vertical support bars are configured to support the one or more glass substrates along their vertical edges. In certain arrangements, multiple glass substrates may be stacked vertically. There may be horizontal support bars, clips or nothing between adjoining vertically stacked glass substrates. The vertical support bars are supported by vertical grid mounts. The vertical support bars may be slideably engaged with the vertical grid mounts. The vertical grid mounts may also slide with the glass as it expands or contracts. The vertical grid mounts may be made of a material that has a CTE similar to glass. In certain embodiments, the glass substrate moves with the vertical grid support as each expands and contracts. In certain embodiments, the adjustable grid array may include one or more springs between a glass substrate and its supporting vertical support bars, that maintain the glass substrate centered between the vertical supports during expansion and contraction.

The components of the adjustable grid array are configured such that a work surface of each of the plurality of glass substrates or of the single glass substrate may be masked about its periphery. That is, for example, sputter deposition may be blocked from depositing material in the masked areas in some cases. For example, masking may be used to prevent back side deposition. In certain embodiments, each glass substrate(s) is masked about its periphery between about 2 mm and about 15 mm. In one embodiment, the vertical and horizontal support bars include elements to provide masking the periphery of the glass. The adjustable grid array may also be configured to include an electrically conductive component configured to establish electrical communication with an electrically conductive coating on the work surface of each of the glass substrates. In one embodiment, the electrically conductive component is one or more springs that are part of the adjustable grid array, e.g. that make contact with the work surface of the glass only on the regions which are masked (i.e. between the masking elements and the electrically conductive coating on the glass). In one case, there may be no front side or edge masking.

Referring again to FIG. 5, in certain embodiments, glass substrates may be loaded into an aperture from the bottom up (e.g., a column of a vertical stack of glass substrates may be loaded from the bottom up). That is, once sizes of the substrates to be loaded are determined, vertical and horizontal support bars of appropriate sizes can be selected. A first glass substrate may be loaded onto the bottom horizontal support bar. Next, another horizontal support bar is placed atop the first glass substrate, and another glass substrate (if any) is placed atop the second horizontal support bar. The vertical support bars are then used to "cap" the ends of the glass substrate stack thus formed, and the next column of vertically-stacked glass substrates is loaded using the appropriate horizontal support bars, clips or glass to glass, depending on the particular application (see above). In some embodiments, the glass substrates are loaded from the rear of the pallet; that is, so the handling of the glass is from the side away from the work surface so as to avoid contamination of the work surface.

In one embodiment, a horizontal support bar is retained with a clip attached to a vertical support bar so that in the event of glass breakage, the horizontal support bar doesn't fall off the pallet and potentially get stuck inside the sputtering apparatus. In embodiments where the vertical support bars have a slot to accommodate the horizontal support bar, clips may not be necessary.

In some embodiments, the horizontal support bars may be configured at various angles (from horizontal) to allow for receiving glass substrate(s) of different (non-rectangular, e.g.) shapes in the grid. In some cases, the horizontal support bars may be in the form of a chain, which articulates and captures the glass substrate's shape, or e.g., a plurality of short spans of horizontal support grids can be used to accommodate non-rectangular shape's edges. In one embodiment, the horizontal support bar is a bent piece of sheet metal or U-channel, or H-channel or clips. In some cases, by placing complimentary shaped glass substrates either edge to edge or with one of horizontal support bars described herein, one can fit irregular shapes (e.g., non-rectangular shapes such as triangular, trapezoidal, circular, etc.) into a standard rectangular grid.

In certain embodiments, rather than horizontal bars, H-clips may be used between vertically stacked substrates. These H-clips are clips whose cross section approximates an "H" shape having channel sections on opposing sides. That is, each H-clip can fit over the top edge of one glass substrate, and an adjoining vertically stacked glass substrate's bottom edge fits into the other opposing channel of the H-clip.

Once the aperture is loaded with the desired glass substrate(s), the pallet is loaded into the sputtering apparatus, either alone or in a train of pallets (described in more detail below). Thus, each of the glass substrates is held only by its edges during sputtering and the back side, non-work surface, is protected from sputtered materials. Shields may be attached prior to, or after the glass substrate is loaded into the pallet's aperture.

As described above, in certain embodiments, a pallet is either configured to link with like adjacent pallets, e.g., in a modular format, so as to form a train of pallets that are configured to translate through a sputtering apparatus or individual pallets will abut each other occasionally during their movement through a sputtering apparatus. A sputtering apparatus configured to deposit, e.g., an electrochromic device stack onto a glass substrate, using pallets of the dimensions described herein may be several hundred feet long and pallets may be moving along at different rates and positions within the sputtering system simultaneously. Occasionally pallets may abut each other and then be separated again, e.g. as a leading pallet is accelerated into a next processing station. In one embodiment, the pallet includes overlapping portions, 230, on the frame, these edge portions are configured to overlap with neighboring pallets in the train, so as to protect the backside of the plurality of glass substrates from sputter deposits.

FIG. 6 depicts two pallets 200, and details an exemplary overlapping portion, 230. As seen in the detailed portion of FIG. 6 (dotted circles, showing view from the bottom of the two pallets), overlapping portions 230 may be configured so that when two carriers come into close proximity, or abut, there is some overlap between these edge portions. This protects the backside from sputtered materials. The gap between neighboring pallets can be controlled by the drive system of the sputtering apparatus or can be linked mechanically. In one embodiment, a minimum gap between adjoining pallets is mechanically limited, whether the pallets are physically linked or not. For example, there may be a bumper that prevents pallets from ramming into each other or at least prevents them from coming within the minimum gap of each other.

Certain embodiments include pallets that hold a single large substrate, rather than a plurality of glass substrates. One embodiment is a pallet for transporting a large glass substrate through a sputtering apparatus (e.g., integrated sputter deposition system), the pallet including a frame including an aperture. The pallet is configured to hold the glass substrate by at least two edges, and in a substantially vertical orientation during transport through the sputtering apparatus. In some cases, the glass substrate may have dimensions of between about 60 inches and about 130 inches along one side and between about 60 inches and 205 inches along the other side. In some cases, the glass substrate has a thickness of between about 2 mm and about 20 mm thick. In one embodiment, the pallet may be configured to hold a glass substrate with length and width of up to 72×120 inches and with a thickness of between about 2 mm and about 20 mm. In some cases, the pallet may include portions that mask the work surface of the glass substrate about its periphery, e.g., between about 2 mm and about 15 mm. In certain aspects, the pallet may include an electrically conductive component configured to establish electrical communication with an electrically conductive coating on a work surface of the glass substrate, e.g., one or more springs. In certain aspects, the pallet may be configured to maintain its temperature to within ±5° C. of the temperature of the glass substrate during sputtering. In one embodiment, the pallet weighs less than 700 kg. In one embodiment, the pallet is made of stainless steel. As described above, the pallet may be configured to prevent backside contamination of the glass substrate during sputtering. The pallet may further include a guide plate along its top edge to aid alignment with rollers in the sputtering apparatus and/or a guide bar along its bottom edge to aid alignment with a drive system in the sputtering apparatus. The pallet may be configured to hang from the drive system in the sputtering apparatus. In one embodiment, the pallet may be configured to be transported by a magnetic levitation drive system, for example, from either above the pallet or below the pallet. As described in embodiments above, the frame may include a U-channel, of an assembly of modular pieces or a unitary body, e.g., welded together. One or more shields can be used to cover portions of the pallet during sputtering. These shields may reversibly attach to the frame as described herein and include a shield retaining feature that accommodate differences in thermal expansion between the one or more shields and the frame. The pallet may be configured to mechanically link with like adjacent pallets in a modular format, so as to form a train of pallets that are configured to translate through the sputtering apparatus and further include edge portions on the frame configured to overlap with neighboring pallets in the train, so as to protect the backside of the plurality of glass substrates from sputter deposits. The pallet may also be configured to allow a variable gap between the neighboring pallets when mechanically linked, the variable gap controlled actively by the drive system of the sputtering apparatus. A minimum distance of the variable gap may be controlled by a mechanical limit.

In one embodiment, a pallet has one or more components made of material(s) having coefficients of thermal expansion properties that are lower than that of the material of the substrate. In this aspect, the flexibility of the adjustable grid array can adjust for any expansion of the substrate(s). Some examples of such materials include 1) molybdenum, niobium, tungsten or other refractory metals, 2) composites like carbon-carbon composites, 3) titanium and titanium alloys (e.g., alloying elements for titanium such as vanadium, aluminum, tin, molybdenum and/or palladium), 4) martensitic stainless steels, 5) steel alloys, 6) other thermal expansion controlled alloys such as invar and kovar, 6) ceramics such as silicon nitride, zircon, cordierite, zirconia, zirconium, zirconium carbide, and 7) super alloys, or high nickel alloys, such as Inconel, Monel, Hastelloy, Waspaloy and the like.

In the description herein, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Although the foregoing invention has been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. A pallet, comprising:
a frame comprising an aperture; and
an adjustable grid array located within the aperture, the adjustable grid array adjustable to hold a plurality of glass substrates of different shapes and/or sizes at the same time in a substantially vertical orientation while the pallet is transporting a plurality of glass substrates through a sputtering apparatus;
wherein the adjustable grid array is adjustable to hold each glass substrate of said plurality of glass substrates by at least two straight edges;
wherein the adjustable grid array comprises a plurality of vertical support bars configured to hold the plurality of glass substrates along their vertical edges; and
wherein the adjustable grid array is configured without intervening horizontal support structure for supporting horizontal edges between adjacent glass substrates of the plurality of glass substrates such that the glass substrates are stacked upon each other vertically.

2. The pallet of claim 1, wherein the aperture is between about 60 inches and 130 inches along a first dimension, and between about 72 inches and about 205 inches along a second dimension.

3. The pallet of claim 1, further comprising an electrically conductive component configured to establish electrical communication with an electrically conductive coating on a work surface of at least one glass substrate of the plurality of glass substrates.

4. The pallet of claim 1, further comprising an overlapping portion configured to prevent backside contamination of the plurality of glass substrates during sputtering.

5. The pallet of claim 1, wherein the pallet is configured to hang from a drive system in the sputtering apparatus.

6. The pallet of claim 1, further comprising one or more shields covering one or more portions of the pallet.

7. The pallet of claim 6, further comprising a shield-retaining feature that accommodates thermal expansion and/or thermal contraction between the one or more shields and the frame.

8. The pallet of claim 1, further comprising edge portions of the frame, the edge portions configured to overlap with one or more adjacent pallets, and configured to protect the backside of the plurality of glass substrates from sputter deposits.

9. The pallet of claim 1, wherein the vertical support bars comprise a spring that allows for each of the plurality of glass substrates to expand and contract while keeping each of the plurality of glass substrates centered in space between two vertical support bars.

10. The pallet of claim 1, wherein the pallet is configured to maintain its temperature to within +5° C. of the temperature of the glass substrate while the pallet is transported through the sputtering apparatus during sputtering.

11. The pallet of claim 1, further comprising a guide plate along a top edge of the frame to align the frame with one or more rollers in the sputtering apparatus.

12. The pallet of claim 1, further comprising a guide bar along a bottom edge of the frame to align the frame with a drive system in the sputtering apparatus.

13. The pallet of claim 1, wherein the pallet is configured to mechanically link with adjacent pallets in a train of pallets configured to translate through the sputtering apparatus.

14. The pallet of claim 13, wherein the pallet is configured to allow a variable gap between the adjacent pallets when mechanically linked.

15. An integrated sputter deposition system comprising:
a plurality of deposition stations;
a plurality of pallets, each pallet comprising:
   a frame comprising an aperture; and
   an adjustable grid array located within the aperture, the adjustable grid array adjustable to hold a plurality of glass substrates of different shapes and/or sizes at the same time in a substantially vertical orientation while the pallet is transporting a plurality of glass substrates through a sputtering apparatus;
   wherein the adjustable grid array is adjustable to hold each glass substrate of said plurality of glass substrates by at least two straight edges;
   wherein the adjustable grid array comprises a plurality of vertical support bars configured to hold the plurality of glass substrates along their vertical edges; and
   wherein the adjustable grid array is configured without intervening horizontal support structure for supporting horizontal edges between adjacent glass substrates of the plurality of glass substrates such that the glass substrates are stacked upon each other vertically; and
a drive system for controlling movement of the plurality of pallets through the plurality of deposition stations.

16. The integrated sputter deposition system of claim 15, wherein at least one pallet of the plurality of pallets is configured to mechanically link with adjacent pallets in the plurality of pallets.

17. The integrated sputter deposition system of claim 15, wherein drive system is configured to maintain a variable gap between adjacent pallets in the plurality of pallets.

18. The integrated sputter deposition system of claim 17, wherein the drive system is configured to maintain at least a minimum gap adjacent pallets in the plurality of pallets.

* * * * *